United States Patent
Noh (10) Patent No.: US 9,666,308 B2
(45) Date of Patent: May 30, 2017

(54) POST PACKAGE REPAIR DEVICE

(71) Applicant: SK hynix Inc., Icheon-si, Gyeonggi-do (KR)

(72) Inventor: Young Kyu Noh, Seongnam-si (KR)

(73) Assignee: SK hynix Inc., Icheon-Si (KR)

( * ) Notice: Subject to any disclaimer, the term of this patent is extended or adjusted under 35 U.S.C. 154(b) by 115 days.

(21) Appl. No.: 14/698,617

(22) Filed: Apr. 28, 2015

(65) Prior Publication Data

US 2016/0217873 A1 Jul. 28, 2016

(30) Foreign Application Priority Data

Jan. 26, 2015 (KR) ........................ 10-2015-0012094

(51) Int. Cl.
| | |
|---|---|
| *G11C 29/00* | (2006.01) |
| *G11C 29/44* | (2006.01) |
| *G11C 29/54* | (2006.01) |
| *G11C 11/4072* | (2006.01) |
| *G11C 11/408* | (2006.01) |

(52) U.S. Cl.
CPC .......... *G11C 29/78* (2013.01); *G11C 29/4401* (2013.01); *G11C 11/408* (2013.01); *G11C 11/4072* (2013.01)

(58) Field of Classification Search
CPC ... G11C 29/78; G11C 11/4072; G11C 11/408; G11C 29/72; G11C 29/44; G11C 29/4401
See application file for complete search history.

(56) References Cited

U.S. PATENT DOCUMENTS

| | | | | |
|---|---|---|---|---|
| 4,628,512 A | * | 12/1986 | Loo .......................... | G11C 8/00 714/820 |
| 9,037,949 B1 | * | 5/2015 | Vogelsang .......... | G06F 11/1048 714/724 |
| 9,401,227 B2 | * | 7/2016 | Noh ....................... | G11C 29/78 |
| 9,432,298 B1 | * | 8/2016 | Smith .................. | H04L 49/9057 |
| 2006/0203578 A1 | * | 9/2006 | Meaney ................. | G11C 29/44 365/200 |
| 2008/0198684 A1 | * | 8/2008 | Sakamoto ................ | G11C 8/06 365/230.08 |
| 2009/0185438 A1 | * | 7/2009 | Kim ....................... | G11C 5/025 365/200 |

(Continued)

FOREIGN PATENT DOCUMENTS

| | | | |
|---|---|---|---|
| KR | 1020070082815 A | | 8/2007 |
| KR | 20080061951 A | * | 7/2008 |

*Primary Examiner* — April Y Blair
*Assistant Examiner* — Dipakkumar Gandhi
(74) *Attorney, Agent, or Firm* — William Park & Associates Ltd.

(57) ABSTRACT

A post package repair (PPR) device is disclosed, which relates to a technology for masking a rupture operation in case of a post package repair (PPR) operation. The post package repair (PPR) device includes: a plurality of bank groups, each including a fuse indicating repair information, configured to share a predetermined number of fuses; a resource detection unit configured to generate a resource signal which determines whether the fuses from among the plurality of bank groups are available; and a masking controller configured to output a masking signal which prevents repeated execution of a rupture operation when there is no unused fuse in response to the resource signal and a bank active signal.

17 Claims, 10 Drawing Sheets

(56) References Cited

U.S. PATENT DOCUMENTS

2011/0280091 A1* 11/2011 Rooney ................. G11C 17/18
365/200
2013/0083612 A1 4/2013 Son et al.
2014/0289574 A1* 9/2014 Tsern ............... G11C 29/50016
714/718

* cited by examiner

POST PACKAGE REPAIR DEVICE

CROSS-REFERENCE TO RELATED APPLICATION

This application claims priority based upon Korean patent application No. 10-2015-0012094, filed on Jan. 26, 2015, the disclosure of which is hereby incorporated in its entirety by reference herein.

BACKGROUND OF THE INVENTION

Embodiments of the invention relate to a post package repair device, and more particularly to a technology for masking a rupture operation in case of a post package repair operation.

A Dynamic Random Access Memory (DRAM) includes a plurality of memory cells arranged in the form of a matrix. However, if a defective or failed cell occurs in at least one memory cell from among a plurality of memory cells, it is impossible for a semiconductor memory device to be normally operated, so that the semiconductor memory device having the defective cell is regarded as a defective product and abandoned. As the semiconductor memory device has been developed to have a higher degree of integration at a higher speed, there is a higher possibility of causing defective cells.

As a result, a production yield denoted by the ratio of a total number of chips to the number of normal chips, which is needed for deciding production costs of DRAMs, is gradually reduced. Therefore, in order to increase a production yield of semiconductor memory devices, many developers and companies are conducting intensive research into a method for fabricating highly-integrated semiconductor memory devices configured to operate at a higher speed and a method for efficiently repairing defective cells.

A method for repairing a defective cell of DRAMs is classified into a method (hereinafter referred to as a wafer repair method) for repairing the defective cell in a wafer state and a method (hereinafter referred to as a packaging repair method) for repairing the defective cell in a packaging state.

In this case, the wafer repairing method performs testing of memory cells of the semiconductor memory device at a wafer level, and replaces a defective cell with a redundancy cell. The packaging repair method performs testing of memory cells of the semiconductor memory device at a package state, and replaces a defective cell with a redundancy cell at the package state. The above-mentioned case in which repairing of the defective cell is performed at a package state is referred to as a Post Package Repair (PPR) method.

However, according to a circuit structure capable of being simultaneously replaced with redundancy word lines of two banks during a post package repair (PPR) operation, fuse resources can be simultaneously reduced. In addition, it is impossible to recognize the presence or absence of the remaining fuses available to the PPR operation. In addition, it is impossible for the fuse structure allocated to each independent bank to maximally use a plurality of fuses, and the rupture operation can be repeatedly performed irrespective of the remaining fuses during the PPR operation.

SUMMARY

In accordance with an embodiment of the invention, a post package repair (PPR) device includes a plurality of bank groups, each including a fuse indicating repair information, configured to share a predetermined number of fuses. The PPR device also includes a resource detection unit configured to generate a resource signal which determines whether the fuses from among the plurality of bank groups are available. The PPR device also includes a masking controller configured to output a masking signal which prevents repeated execution of a rupture operation when there is no unused fuse in response to the resource signal and a bank active signal.

In accordance with an embodiment of the invention, a post package repair (PPR) device includes an Array Rupture Electrical fuse (ARE) array device having a fuse array configured to store a failed address. The PPR device also includes a boot-up controller configured to scan the fuse array during a post package repair (PPR) operation, and output fuse resource information. The PPR device also includes a resource detection device configured to store the fuse resource information, and output a resource signal indicating whether a fuse is available. The PPR device also includes a masking controller configured to output a masking signal which prevents repeated execution of a rupture operation when there is no unused fuse in response to the resource signal and a bank active signal. The PPR device also includes a rupture controller configured to control a rupture operation of the ARE array device in response to the masking signal.

In an embodiment of the invention, a post package repair (PPR) device includes a plurality of bank groups each including fuse lines allocated for a PPR operation. The PPR device also includes a resource detection device configured to detect resource information of each bank in the plurality of bank groups and output a resource signal. The PPR device also includes a masking controller configured to receive the resource signal and perform a masking operation for each of the banks of the plurality of bank groups during the PPR operation.

DETAILED DESCRIPTION

Reference will now be made in detail to embodiments of the invention, examples of which are illustrated in the accompanying figures. Wherever possible, the same reference numbers are used throughout the figures to refer to the same or like portions. In the following description of the invention, a detailed description of related known configurations or functions incorporated herein may be omitted for clarity of the subject matter of the invention. The embodiments of the invention may relate to a technology for masking repeated rupture in a multi-channel memory device during a post package repair operation.

Figure 1:
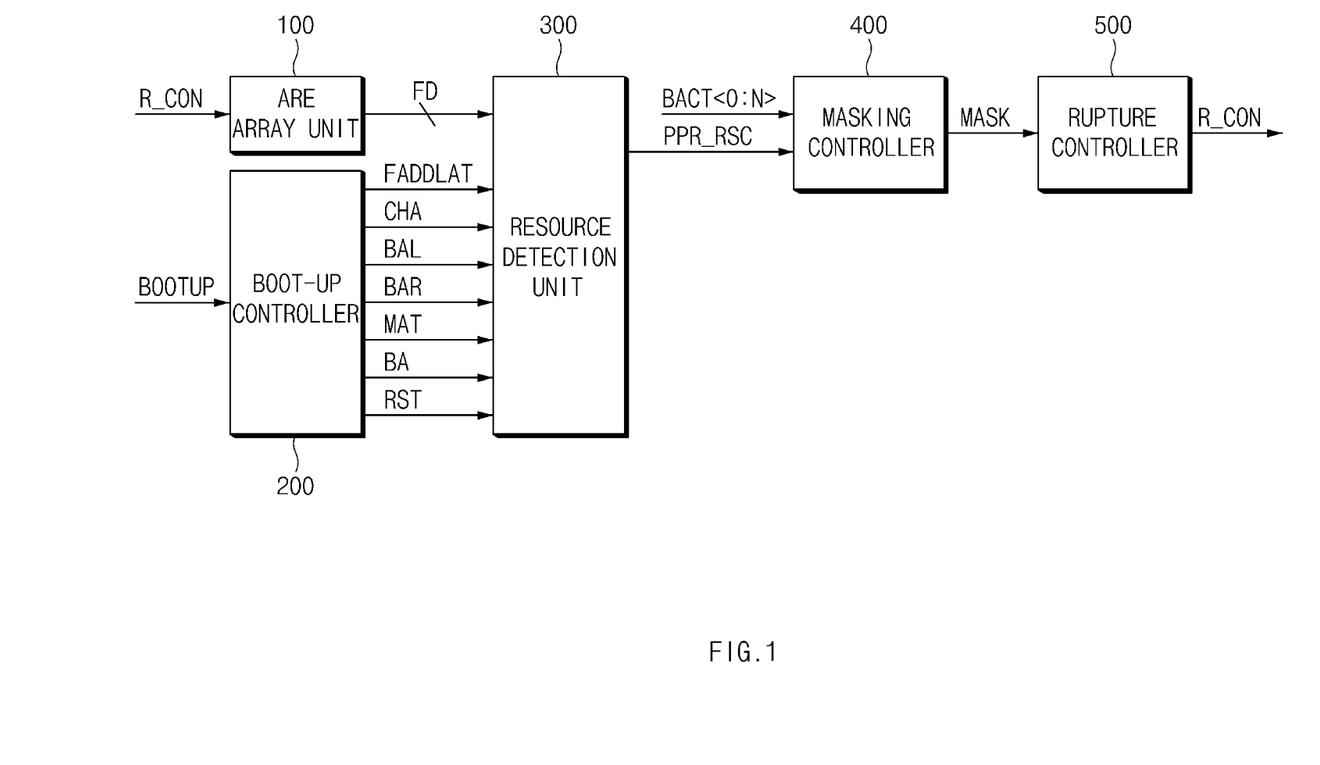
FIG. 1 is a block diagram illustrating a post package repair (PPR) device according to an embodiment of the invention.

Referring to FIG. 1, a block diagram illustrating a post package repair (PPR) device according to an embodiment of the invention is described.

In FIG. 1, the post package repair (PPR) device according to an embodiment includes an Array Rupture Electrical fuse (ARE) array unit 100, a boot-up controller 200, a resource detection unit 300, a masking controller 400, and a rupture controller 500.

As respective constituent elements of the semiconductor integrated circuit (IC) device become super-miniaturized in size and the number of elements contained in one semiconductor chip is rapidly increasing, the level of defect density is also increasing. The increasing defect density may directly deteriorate a production yield or productivity of the semiconductor devices. If the defect density excessively increases, wafers in which the semiconductor device is formed must be discarded and abandoned.

To deteriorate the defect density, a redundancy circuit for replacing the defective cell with a redundancy cell has been proposed. The redundancy circuit (or a fuse circuit) may be installed into each of a row-based line (e.g., word line) and a column-based line (e.g., bit line) of the semiconductor memory device.

The redundancy circuit may include an ARE array unit 100 configured to store address information of a defective cell. The ARE array unit 100 may include a plurality of fuse sets that each include a plurality of fuse lines. The ARE array unit 100 is a memory that stores information of respective bits of all failed addresses therein. The ARE array unit 100 may select the corresponding row line according to the address ARE_ADD indicating fuse selection information.

Respective fuse-sets are configured to perform information programming by melting the fuse due to the occurrence of an overcurrent. In addition, each fuse-set may perform self-repairing (i.e., repair or rupture) to relieve or save failed bits in a memory package state.

Upon completion of memory testing, the ARE array unit 100 applies the testing result information to the memory. In addition, the ARE array unit 100 ruptures the electrical fuse corresponding to each bit so that the ARE array unit 100 permanently stores information (i.e., failure information) regarding the failed parts. In this case, the ARE array unit 100 may control the rupture operation upon receiving the rupture control signal (R_CON) from the rupture controller 400.

If the address R_CON is activated, the ARE array unit 100 may store address information of a defective cell according to the rupture operation. On the other hand, the ARE array unit 100 may not perform the rupture operation when the rupture control signal (R_CON) is deactivated. In this case, each fuse-set may be implemented as an electrical fuse (E-fuse) that performs information programming by melting the fuse due to the occurrence of an overcurrent.

The ARE array unit 100 may output the previously stored fuse data FD (row fuse data and column fuse data) prior to operating the memory upon completion of the power-up operation.

The semiconductor device may initiate the boot-up operation to read information of the ARE array unit 100 according to a power-up signal. Bit information of the accessed fuse-set is loaded on fuse data FD and is sequentially output to the resource detection unit 300.

The ARE array unit 100 may sequentially read a plurality of fuse-sets from a first fuse-set to the last fuse-set. If the read operation of the ARE array unit 100 is performed, defective-cell address information stored in the fuse-sets from the first fuse-set to the last fuse-set can be sequentially or simultaneously read.

The boot-up controller 200 may scan fuses to be used for the post package repair (PPR) operation. Further, the boot-up controller 200 may output the scanned fuse resource information to the resource detection unit 300. In this case, the boot-up controller 200 may output the prestored fuse resource information as 1-bit information using a Mode Register Set (MRS).

The boot-up controller 200 may initiate the boot-up operation according to a boot-up signal (BOOTUP) and may output an address (FADDLAT) indicating the position of a fuse line in response to the counting operation.

The boot-up controller 200 may output a channel selection signal CHA needed for reading information indicating which channel has an unused fuse. In addition, the boot-up controller 200 may output bank selection signals BAL, BAR needed for reading fuse use information of a left region and a right region in each bank. In addition, the boot-up controller 200 may output a mat selection signal MAT needed for reading information indicating which mat has an unused fuse within each bank.

The boot-up controller 200 may output a bank-group selection signal BA needed for reading specific information indicating which region has an unused fuse within each bank. In addition, the boot-up controller 200 may output a reset signal RST to reset data stored in each bank.

The boot-up controller 200 may scan fuse data regarding a failed address stored in an electrical fuse of the ARE array unit 100 prior to operating the memory upon completion of a power-up operation.

The boot-up controller 200 scans row or column fuse information ruptured in the ARE array unit 100 and thus an address (FADDLAT) indicating the used or unused state of the fuses to the resource detection unit 300. In this case, during the boot-up operation, the boot-up controller 200 may search for each fuse region in all banks of the ARQ array unit 100. The use information of the fuse set is output to the resource detection unit 300.

To recognize information as to whether the last user of the semiconductor device uses the fuses, a Post Package Repair (PPR) function is needed. For this purpose, it is necessary for the semiconductor device to include electrical fuses therein. In addition, it is also necessary for the semiconductor device to include a resource detection unit 300 configured to recognize whether the fuse is available or not.

Prior to the PPR operation, resources located in each bank and each channel are sensed through fuse resource scanning. If a fuse for PPR is present, the resource detection unit 300 may output resource information of the fuse to the masking controller 400.

For this purpose, the resource detection unit 300 may store resource information of each fuse to detect the number of fuses unused in the boot-up operation. The resource detection unit 300 may latch ARE addresses of the PPR fuse region allocated during the boot-up operation. To this end, the resource detection unit 300 may discriminate among per-channel region, per-bank region, per-mat region, so that the resource detection unit 300 may read resource data according to the discriminated result.

The resource detection unit 300 may latch resources of all fuses either in several channels or in several banks of each channel during the boot-up operation. Therefore, the user can discard the PPR fuse resource information. Further, the user can determine whether the rupture operation is performed per channel or per bank using the prestored fuse data FD during the PPR operation.

The resource detection unit 300 may receive the address FADDLAT, the channel selection signal CHA, the mat selection signal MAT, the bank-group selection signal BA, the bank selection signals BAL, BAR, and the reset signal RST from the boot-up controller 200. The resource detection unit 300 may receive fuse data FD from the ARE array unit 100. The resource detection unit 300 may also compare the fuse data FD with fuse data received from the boot-up controller 200.

The resource detection unit 300 may select the corresponding channel in response to the channel selection signal CHA and may select the corresponding mat in response to the mat selection signal MAT. The resource detection unit 300 may detect not only resource information of a bank group arranged in an UP region but also resource information of a bank group arranged in a DOWN region according to the bank group selection signal BA. The resource detection unit 300 may select a left or right region of each bank according to the bank selection signal BAL or BAR.

For example, the resource detection unit 300 may select one channel in response to the channel selection signal CHA, may select a bank group in response to the bank-group selection signal BA, may select a mat in response to the mat selection signal MAT, and may select a left bank or a right bank in response to the bank selection signal (BAL or BAR). Further, the resource detection unit 300 may select the fuse address FADDLAT in the selected bank.

The resource detection unit 300 may detect resource information of each bank in response to the address FADDLAT, and may output the resource signal PPR_RSC to the masking controller 400. In addition, the resource detection unit 300 may reset the stored resource detection information in response to the reset signal RST. The resource detection unit 300 may receive fuse data FD from the ARE array unit 100 so as to determine whether or not the fuse is used.

If an unused fuse is not present, the masking controller 400 may output the masking signal MASK to the rupture controller 500 to prevent repeated execution of the rupture operation. In case of the PPR execution, resource information regarding the fuse to be cut by each bank or each channel is compared with the corresponding fuse resource information, so that the rupture operation is not performed when there is no redundant fuse.

The masking controller 400 may perform the masking operation for each bank during the PPR operation. For this purpose, the masking controller 400 may compare the bank active signal BACT<0:N> indicating an active state of all banks with the resource signal PPR_RSC, may determine resource information for each bank, and may selectively activate the masking signal MASK.

The rupture controller 500 may output the rupture control signal R_CON for controlling the rupture operation of an electric fuse contained in the ARE array unit 100 upon receiving the masking signal MASK from the masking controller 400.

Figure 2:
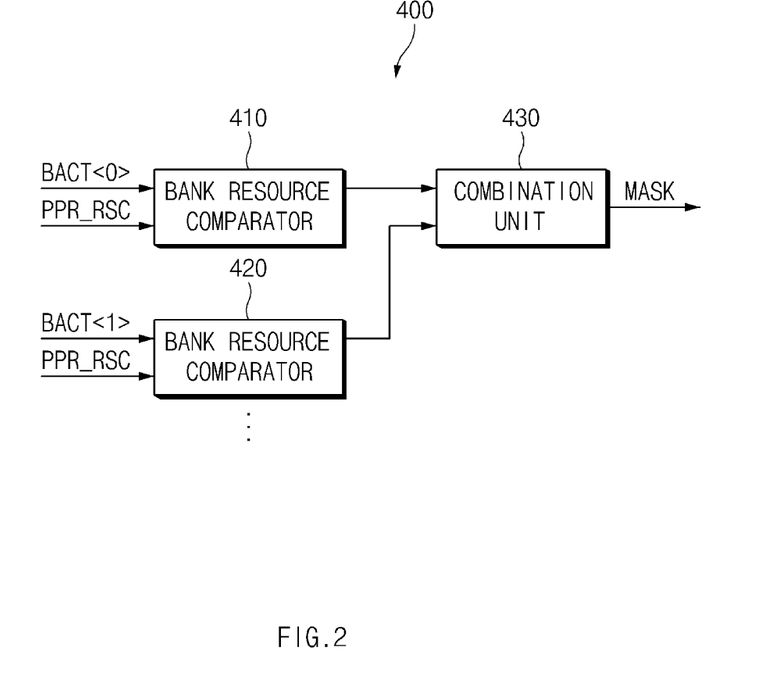
FIG. 2 is a detailed block diagram illustrating a masking controller shown in FIG. 1.

Referring to FIG. 2, a detailed block diagram illustrating the masking controller 400 shown in FIG. 1 is described.

In FIG. 2, the masking controller 400 may include a plurality of bank resource comparators (410, 420) and a combination unit 430.

The bank resource comparator 410 may combine the bank active signal BACT<0> indicating an active state of the bank BK0 (to be described later) and the resource signal PPR_RSC, and may output a combination result. The bank resource comparator 420 may combine the bank active signal BACT<1> indicating an active state of the bank BK1 (to be described later) and the resource signal PPR_RSC and may output a combination result.

The combination unit 430 may combine output signals of the bank resource comparators (410, 420), and may output the masking signal MASK. If output signals of the bank resource comparators (410, 420) are at a high level, the combination unit 430 may output the masking signal MASK at a high level.

Although the embodiments of the invention have disclosed two banks (i.e., two bank resource comparators 410 and 420) for convenience of description and better understanding of the invention, the scope or spirit of the invention is not limited thereto, and the construction of the bank resource comparators may be changed in response to the number of banks.

The number of bank resource comparators (410m 420) configured to determine cut information of the fuse upon receiving PPR fuse resource information and the bank active signal BACT may be changed according to the number of banks and the number of channels. Therefore, if there is an insufficient amount of fuse resources in one memory, the masking operation may be independently performed per bank or per channel, without masking of all fuse cuts.

Figure 3:
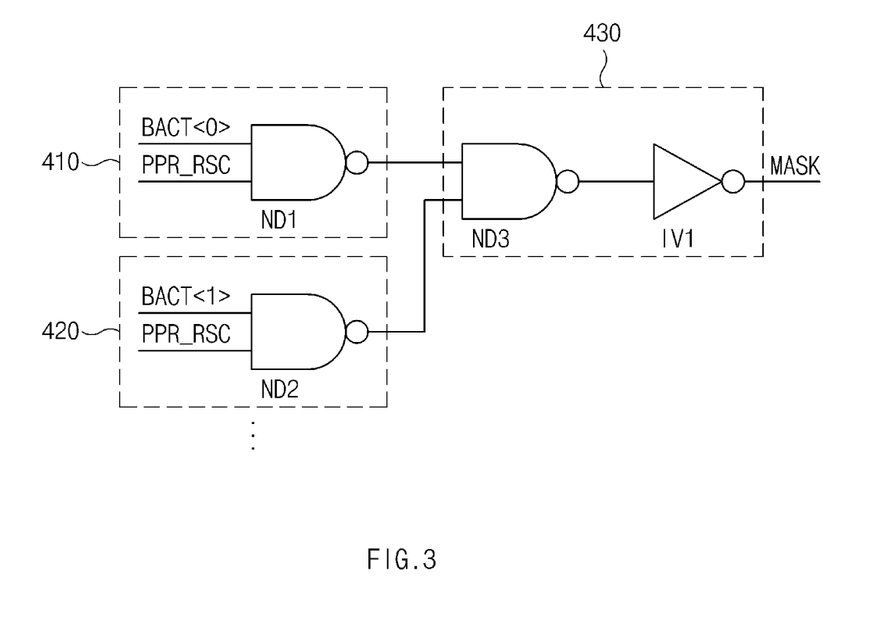
FIG. 3 is a detailed block diagram illustrating a masking controller shown in FIG. 1.

Referring to FIG. 3, a detailed block diagram illustrating the masking controller 400 shown in FIG. 1 is described.

In FIG. 3, the bank resource comparator 410 may include a NAND gate ND1. The NAND gate ND1 may perform a logic NAND operation between the bank active signal BACT<0> indicating an active state of the bank BK0 (to be described later) and the resource signal PPR_RSC.

The bank resource comparator 420 may include a NAND gate ND2. The NAND gate ND2 may perform a logic NAND operation between the bank active signal BACT<1> indicating an active state of the bank BK1 (to be described later) and the resource signal PPR_RSC.

In addition, the combination unit 430 may combine output signals of the bank resource comparators (410, 420), and may output the masking signal MASK according to the combination result. If the output signals of the bank resource comparators (410, 420) are at a high level, the combination unit 430 may output the masking signal MASK at a high level.

For this purpose, the combination unit 430 may include a NAND gate ND3 and an inverter IV1. The NAND gate ND3 may perform a logic NAND operation between the output signals of the bank resource comparators (410, 420). The inverter IV1 may output the masking signal MASK by inverting the output signal of the NAND gate ND3. The combination unit 430 may perform a logic AND operation between the output signals of the bank resource comparators (410, 420). Further, the combination unit 430 may thus output the masking signal MASK.

The above-mentioned masking controller 400 may read resource information per bank, and may control a state of the masking signal MASK.

For example, if the bank BK0 is activated so that the bank active signal BACT<0> is at a high level and the resource signal PPR_RSC is at a high level, an output signal of the bank resource comparator 410 is at a low level. Therefore, the masking signal MASK of the combination unit 430 may be output at a low level.

If the bank BK1 is activated so that the bank active signal BACT<1> is at a high level and the resource signal PPR_RSC is at a high level, an output signal of the bank resource comparator 420 is at a low level. Therefore, the masking signal MASK of the combination unit 430 may be output at a low level.

In addition, if the banks (BK0, BK1) are activated so that the bank active signals (BACT<0>, BACT<1>) are at a high level and the resource signal PPR_RSC is at a high level, the output signals of the bank resource comparators (410, 420) are at a low level. Therefore, the masking signal MASK of the combination unit 430 may be output at a low level.

Further, if the banks (BK0, BK1) are deactivated so that the bank active signals (BACT<0>, BACT<1>) are at a low level and the resource signal PPR_RSC is at a low level, the output signals of the bank resource comparators (410, 420) are at a high level. Therefore, the masking signal MASK of the combination unit 430 is output at a high level. The rupture masking operation is performed by the rupture controller 500 such that the rupture operation is prevented from being repeatedly achieved.

If all fuses are not used, the masking signal MASK is output at a low level so that information indicating the presence of an unused fuse is output to the rupture controller 500. If all fuses are used, the masking signal MASK is output at a high level so that information indicating that all fuses are used is output to the rupture controller 500.

If the masking signal MASK is output at a high level, the rupture controller 500 may determine that all fuses have been completely used. Therefore, if all fuses are completely used, the remaining available fuses are not present so that the rupture masking operation is carried out such that the rupture operation is not repeatedly performed.

If the output signals of the bank resource comparators (410, 420) are at a high level, the combination unit 430 may output the masking signal MASK at a high level. If one fuse of the upper region UP1 and one fuse of the lower region DN1 (i.e., one fuse of the upper mat MAT0 and one fuse of the upper mat MAT1) are respectively used, the combination unit 430 outputs the masking signal MASK at a high level to prevent the rupture masking operation from being performed.

Figure 4:
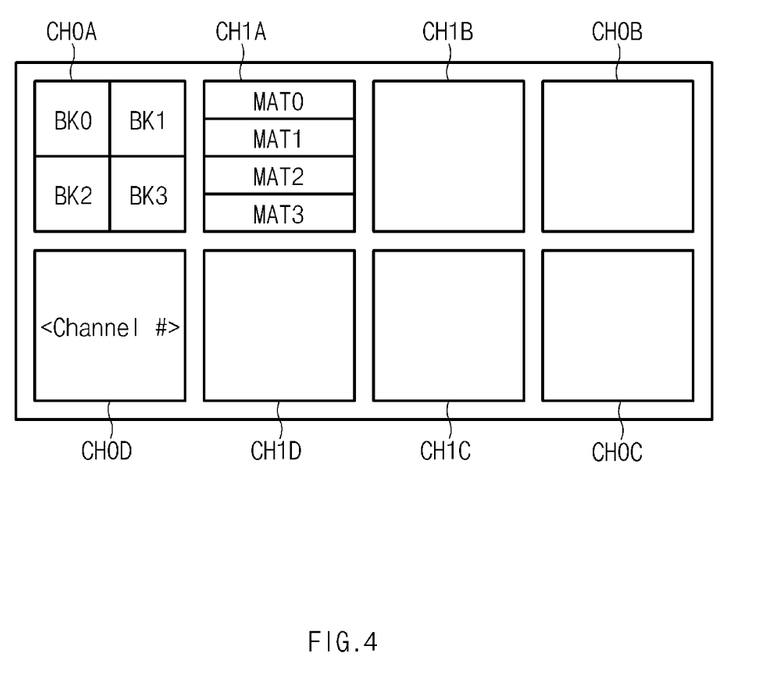
FIG. 4 is a detailed block diagram illustrating channels according to an embodiment of the invention.

Referring to FIG. 4, a detailed block diagram illustrating channels according to an embodiment of the invention is described.

In FIG. 4, a multi-channel structure includes a plurality of channels (CH0A~CH0D) and a plurality of channels (CH1A~CH1D). The channels (CH0A~CH0D) of a first group may be arranged at the outermost region. Further, the channels (CH1A~CH1D) of a second group may be arranged at the center region.

Although the embodiments of the invention have disclosed 8 channels for convenience of description and better understanding of the invention, the scope or spirit of the invention is not limited thereto, and the number of channels and the arrangement relationship of channels may also be modified as necessary.

Each of the channels (CH0A~CH0D) may include a plurality of banks (BK0~BK3). For example, in Channel CH0A, Bank BK0 is arranged at a left upper region, and Bank BK1 is arranged at a right upper region. In Channel CH0A, Bank BK2 is arranged at a left lower region, and Bank BK3 is arranged at a right lower region.

Although the embodiments of the invention have disclosed four banks contained in one channel for convenience of description and better understanding of the invention, the scope or spirit of the invention is not limited thereto. Further, the number of banks and the arrangement relationship of banks may also be modified as necessary.

In addition, each of the channels (CH0A~CH0D) may include a plurality of mats (MAT0~MAT3). For example, one channel CH0A may be classified into four mats (MAT0~MAT3) sequentially arranged.

Although the embodiments of the invention have disclosed four mats contained in one channel for convenience of description and better understanding of the invention, the scope or spirit of the invention is not limited thereto. Further, the number of mats and the arrangement relationship of banks may also be modified as necessary.

Fuse information generated from the ARE array unit 100 may be applied to the channels (CH0A~CH0D) through a row decoder and a repair unit. In addition, the repair operation is performed in response to the fuse information.

Figure 5:
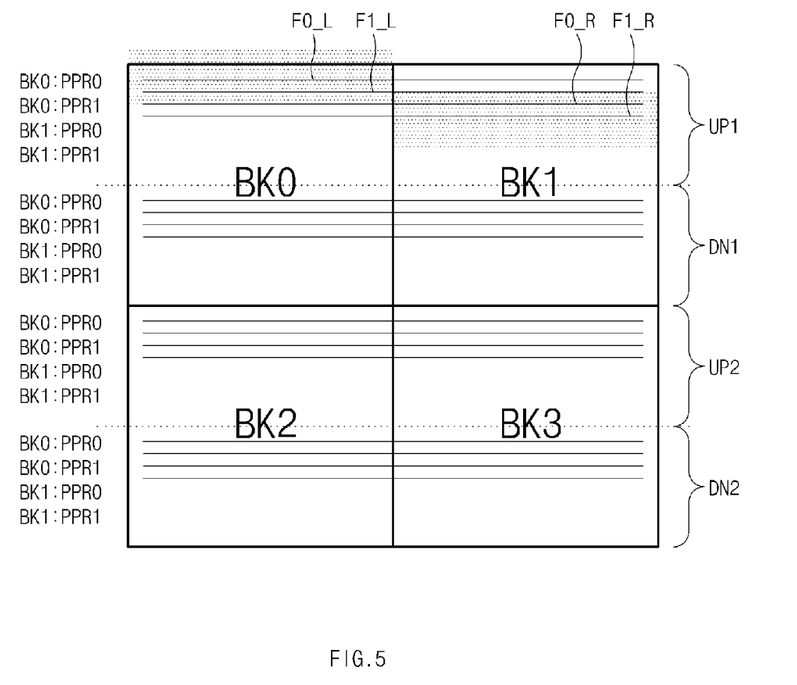
FIG. 5 is a detailed block diagram illustrating a channel shown in FIG. 4.

Referring to FIG. 5, a detailed block diagram illustrating the channel CH0A shown in FIG. 4 is described.

In FIG. 5, one channel CH0A may include a plurality of banks (BK0~BK3). Two upper banks (BK0, BK1) from among the banks (BK0~BK3) are defined as one bank group, and two lower banks (BK2, BK3) are defined as the other bank group. Each of the banks (BK0~BK3) may include fuse lines allocated for the PPR (Post Package Repair) operation.

If the user desires to use the PPR function, the remaining unused fuses are needed so that the user can use the PPR function and the fuse having used the previous PPR can normally operate without any problems. If the fuse to be used for PPR is not present, the previously-used fuse may malfunction and it is difficult to recognize whether the repairing function is failed or there is no fuse.

In addition, during the row repairing mode, if redundancy word lines of two banks are simultaneously replaced, the number of fuse resources is reduced by one. Further, redundancy word lines of two banks are reduced, so that the amount of resources can be reduced to an undesired bank.

For this purpose, two banks are shared by one group during the test mode so that fuse lines can be shared. Therefore, banks can be classified according to the order of fuse lines. In other words, although two banks are shared, fuses can be controlled per bank.

Therefore, according to the embodiments, even when row word lines are simultaneously replaced, resources of respective banks can be output irrespective of simultaneous replacement. Even in the case of using the fuse repair scheme in which two banks are simultaneously replaced, PPR may not affect fuse resources of other banks.

For example, Banks (BK0, BK1) of a first group contained in the upper region UP1 may share fuse lines (F0_L, F1_L, F0_R, F1_R) arranged in a row direction. The upper region UP1 may correspond to the mat MAT0. Banks (BK0, BK1) contained in a lower region DN1 may share the fuse lines arranged in a row direction. The lower region DN1 may correspond to the mat MAT1. In accordance with the embodiments, one mat is divided into a plurality of regions in units of 8K, and fuses may be allocated to the divided regions.

In addition, Banks (BK2, BK3) of a second group contained in the upper region UP2 may share fuse lines arranged in the row direction. The upper region UP2 may correspond to the mat MAT2. Banks (BK2, BK3) contained in a lower region DN2 may share fuse lines arranged in the row direction. The lower region DN2 may correspond to the mat MAT3.

Bank BK0 and Bank BK1 are shared in an embodiment of the invention. However, fuse lines (F0_L, F1_L) of Bank BK0 and fuse lines (F0_R, F1_R) of Bank BK1 are distinguished from each other so that the independent repair operation can be performed. In more detail, even when two banks are simultaneously replaced using only one fuse, the PPR fuse must reduce only resources of the repaired bank.

Although the embodiments of the invention have disclosed four fuse lines on the basis of each mat for convenience of description and better understanding of the invention, the scope or spirit of the invention is not limited thereto. Further, the number of fuse lines contained in each mat may be changed as necessary.

Therefore, the fuse lines allocated to the upper regions of respective banks (BK0~BK3) are defined as BK0, PPR0, and PPR1, respectively. The fuse lines allocated to the lower regions of respective banks (BK0~BK3) are defined as BK1, PPR0, and PPR1, respectively.

For example, the fuse lines (F0_L, F1_L, F0_R, F1_R) may be shared by two banks (BK0, BK1). However, two upper fuse lines (F0_L, F1_L) of the upper region UP1 are allocated to a left bank BK0. Further, and two lower fuse lines (F0_R, F1_R) are allocated to a right bank BK1.

Figure 6:
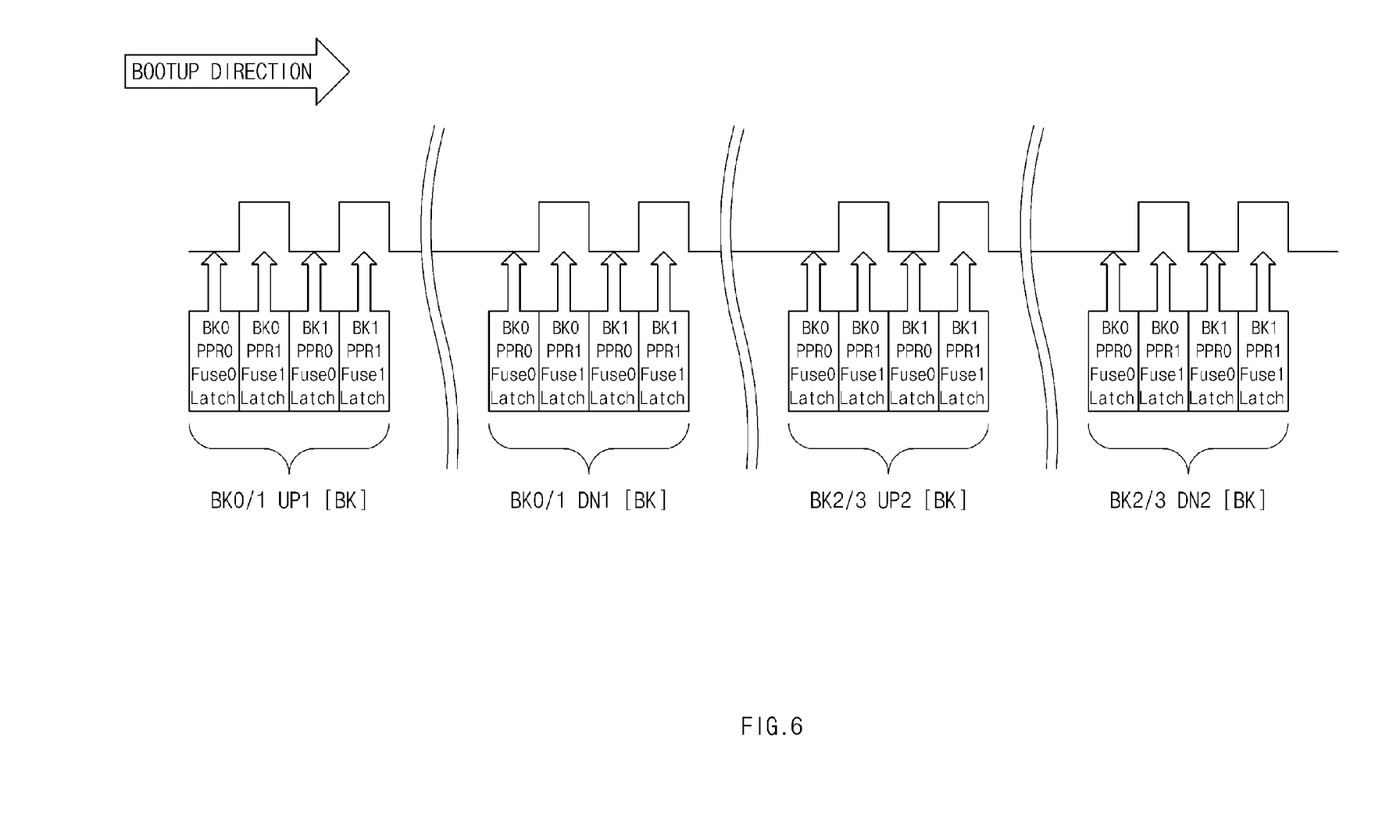
FIG. 6 is a conceptual diagram illustrating a latch order of fuse lines at a channel shown in FIG. 5.

Referring to FIG. 6, a conceptual diagram illustrating a latch order of fuse lines at the channel CH0A shown in FIG. 5 is described.

It is assumed that the boot-up direction of the fuse lines proceeds from the left side to the right side. The resource detection unit 300 of Channel CH0A may be synchronized with a clock signal during the boot-up operation so that the fuse lines of each bank can be sequentially latched.

The resource detection unit 300 may latch the fuse lines contained in the upper region UP1 of the banks (BK0, BK1), and may latch the fuse lines contained in the lower region DN1 of the banks (BK0, BK1). Thereafter, the resource detection unit 300 may latch the fuse lines contained in the upper region UP2 of the banks (BK2, BK3). Further, the resource detection unit 300 may latch the fuse lines contained in the lower region DN2 of the banks (BK2, BK3).

Figure 7:
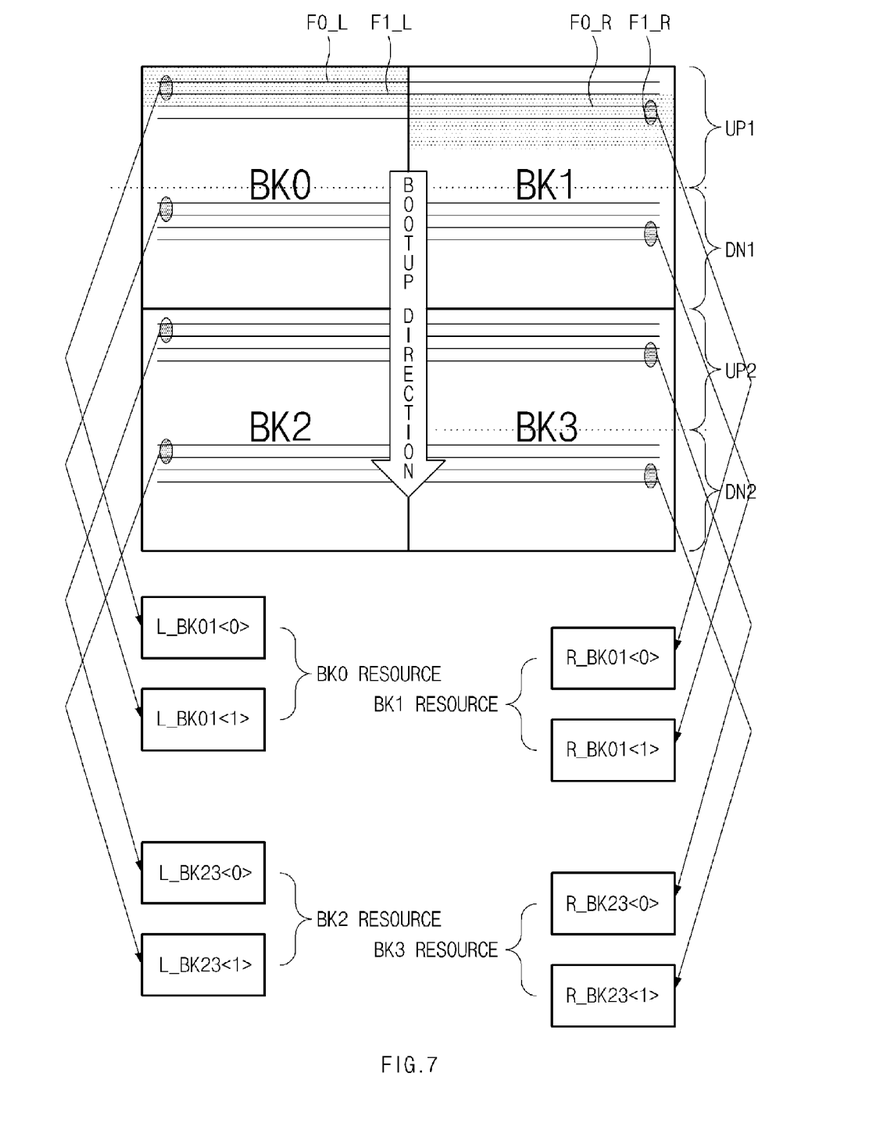
FIG. 7 is a conceptual diagram illustrating a bank allocation method of fuses using a resource detection unit shown in FIG. 1.

Referring to FIG. 7, a conceptual diagram illustrating a bank allocation method of fuses using the resource detection unit 300 shown in FIG. 1 is described.

The resource detection unit 300 may read resource information of the bank BK0 not only at the left bank L_BK01<0> of the upper region UP1 but also at the left bank L_BK01<1> of the lower region DN1. The resource detection unit 300 may read resource information of the bank BK1 not only at the right bank R_BK01<0> of the upper region UP1 but also at the right bank R_BK01<1> of the lower region DN1.

The resource detection unit 300 may read resource information of the bank BK2 not only at the left bank L_BK23<0> of the upper region UP2 but also at the left bank L_BK23<1> of the lower region DN2. In addition, the resource detection unit 300 may read resource information of the bank BK3 not only at the right bank R_BK23<0> of the upper region UP2 but also at the right bank R_BK23<1> of the lower region DN2.

Figure 8:
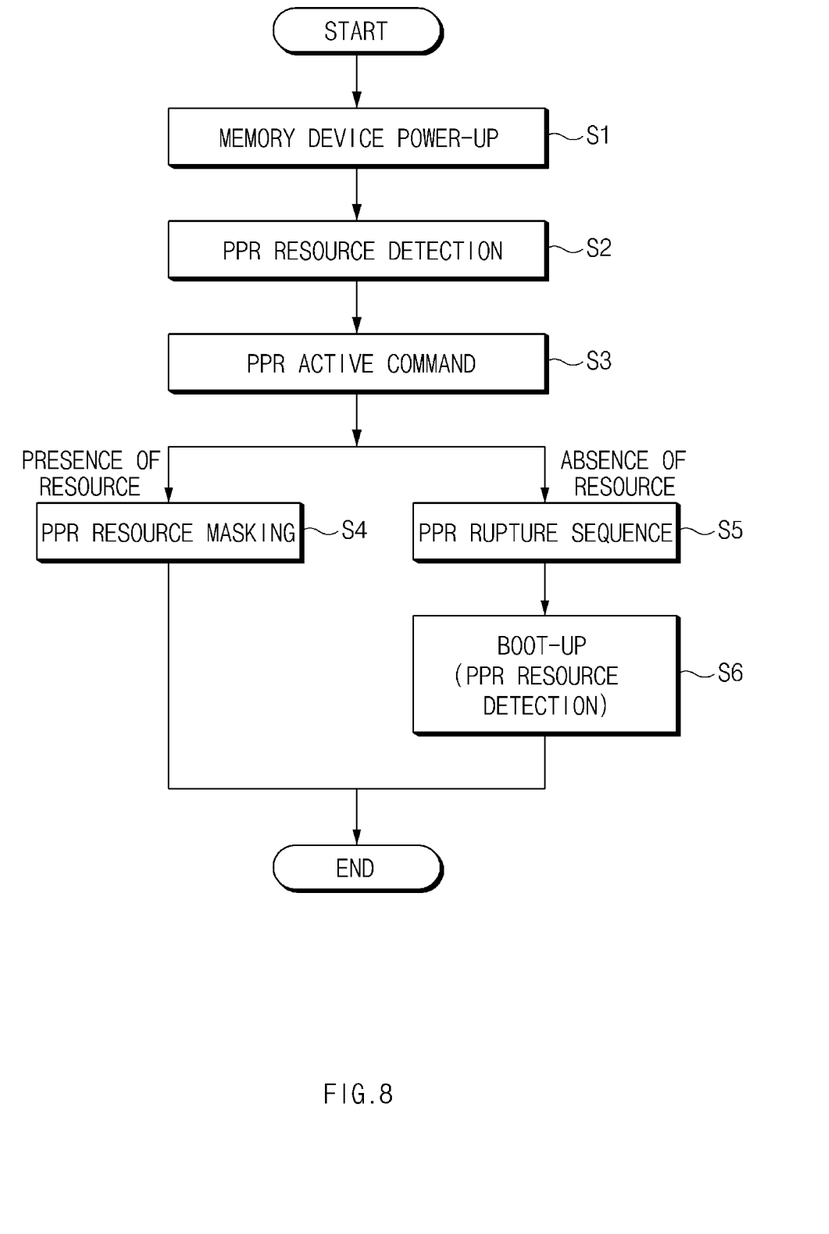
FIG. 8 is a flowchart illustrating a Post Package Repair (PPR) operation according to an embodiment of the invention.

Referring to FIG. 8, a flowchart illustrating a Post Package Repair (PPR) operation according to an embodiment of the invention is described.

In FIG. 8, the boot-up controller 200 may scan fuse data regarding a failed address stored in the electric fuse of the ARE array 100, prior to operation of the memory after completion of the power-up operation of the memory device in step S1. Thereafter, the resource detection unit 300 may scan a redundant fuse available in PPR, and may detect the resource PPR resource in step S2.

The PPR device may receive a PPR active command from the external system in step S3. The PPR device may receive a row active command and a row address to use the PPR. As a result, the PPR device may determine whether repairing is possible using the corresponding channel- or bank-information and the previously scanned and stored fuse resource information.

The resource detection unit 300 may control the masking controller 400 according to the corresponding bank active information and the corresponding resource information. In this case, it may be possible for a memory having multiple banks or a memory having multiple channels to perform the masking operation in response to a state of resource information of each fuse.

If resource information detected from the resource detection unit 300 is not present, the masking controller 400 may perform the PPR resource masking operation in step S4. On the other hand, if resource information detected from the resource detection unit 300 is present, the rupture controller 500 may perform the PPR rupture sequence in step S5.

Thereafter, the boot-up controller 200 may perform the re-bootup operation, and the resource detection unit 300 may re-detect the PPR resources in step S6. The PPR device may detect a resource state of the fuse during the memory power-up operation or after completion of the PPR operation.

Figure 9:
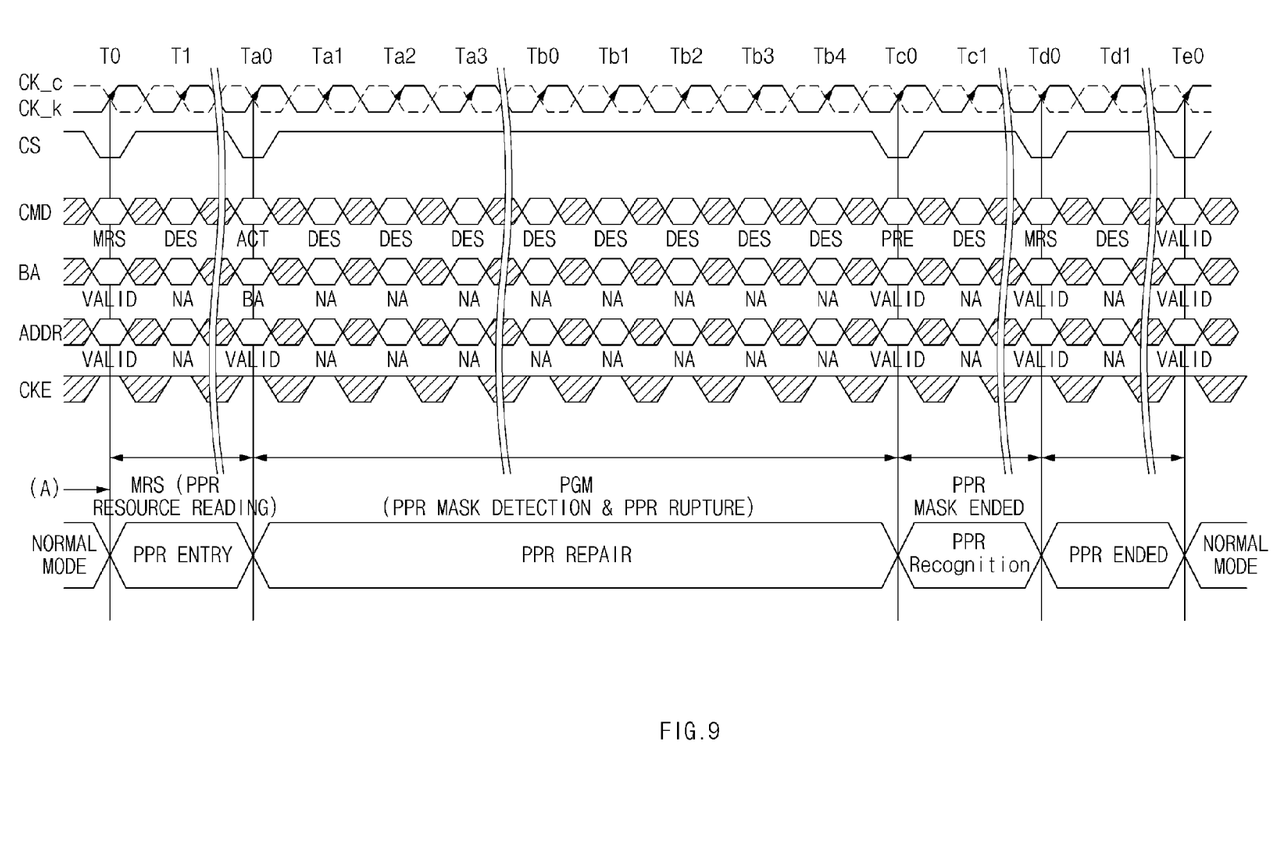
FIG. 9 is a timing diagram illustrating PPR operations according to an embodiment of the invention.

Referring to FIG. 9, a timing diagram illustrating PPR operations according to an embodiment of the invention is described.

In FIG. 9, all banks are maintained in a precharge state during a normal mode, as denoted by (A).

Thereafter, a chip selection signal CS is activated in response to a clock signal CK_C or CK_k in a time section T0 or T1. A mode register set (MRS) command signal CMD and a valid address ADDR are input to the PPR device. The command signals CMD may include MRS, DES, ACT, and VALID. The valid address ADDR may include VALID and NA. If the bank active signal BACT is activated, a bank address BA is input to the PPR device. The bank address BA may include VALID and NA. As a result, a normal mode is changed to a PPR entry mode according to an internal clock CKE. In the time section T0 or T1, the resource detection unit 300 may read the PPR resource.

Subsequently, the PPR operation is performed in time sections (Ta0~Ta3, Tb0~Tb4). During the time sections (Ta0~Ta3, Tb0~Tb4), the masking controller 400 may determine whether the masking operation is performed in response to the PPR resource. The masking controller 400 may control the PPR rupture operation when the masking operation is needed.

Subsequently, the rupture operation and the PPR mask operation are completed in time sections (Tc0, Tc1). Further, the PPR mode is completed in time sections (Td0, Td1). During a time section Te0, a PPR mode is completed so that the PPR mode is switched to a normal mode.

The memory device includes an internal redundant circuit. The system may output a repair command capable of repairing a word line to the packaged memory device. As a result, the memory device is replaced with a redundant circuit using the fuse so that it is possible to perform the repair operation.

The device having a redundant circuit configured to perform the repair operation may have a predeterminedsized fuse circuit. However, the system configured to receive a command from an external part may not recognize a state of the redundant circuit contained in the packaged memory. If the external system recognizes a fuse state of the remaining redundant circuit contained in the memory in the packaging state, there is no problem. However, it may be impossible for most systems to recognize a status of the remaining fuses.

In this instance, the remaining parts of the redundant circuit (also called "redundancy circuit") contained in the memory are not considered. Therefore, the PPR command is applied to the memory under the condition that the system is unable to recognize the fuse state. Therefore, in the case of reusing the previously used fuse, an unexpected redundant word line may be used as necessary.

The PPR device according to the embodiments may pre-recognize resource information of the fuse, prior to execution of the repair operation according to the above situation. If the repairing is impossible, the PPR device may perform masking of the repair operation. Therefore, the PPR device according to the embodiments can prevent the previously used fuse from being overwritten with a fuse having new information.

As is apparent from the above description, the post package repair device according to the embodiments allows a multi-channel memory device to perform masking of repeated rupture during a post package repair operation so that it can prevent a previously-used fuse from being overwritten with a new fuse having new information.

Figure 10:
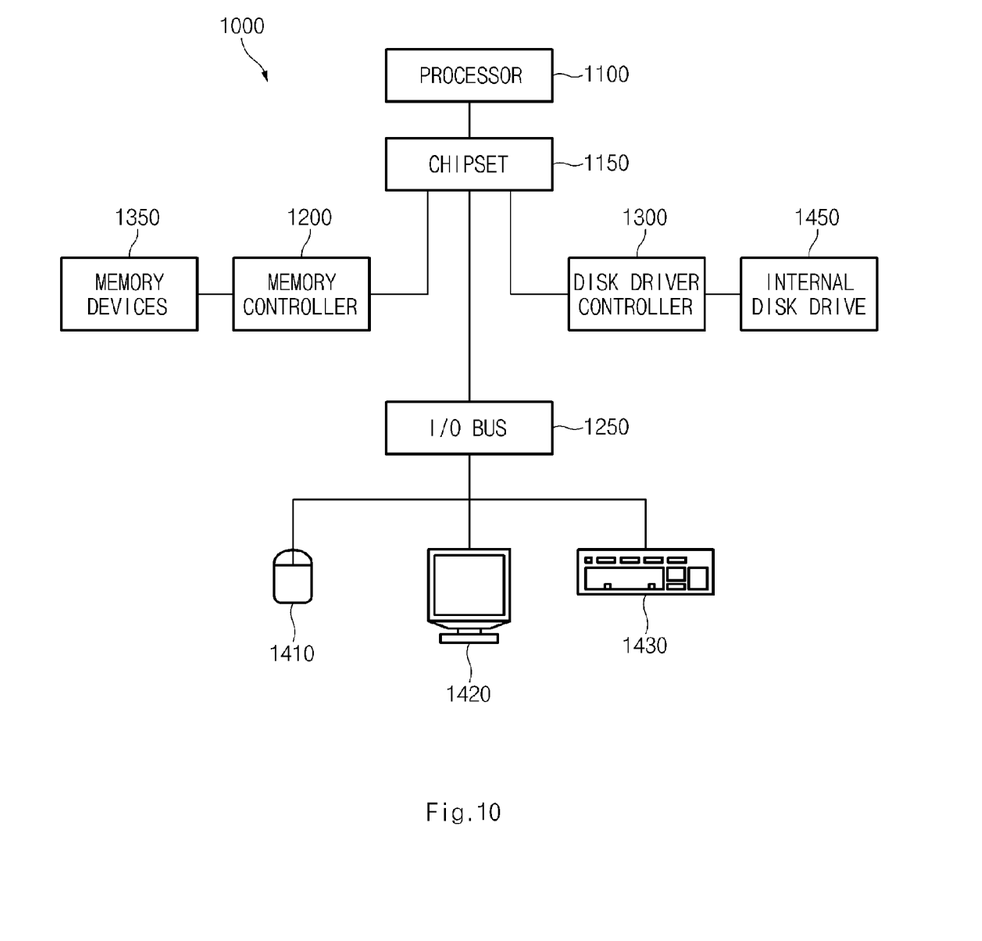
FIG. 10 illustrates a block diagram of a system employing a memory controller circuit in accordance with an embodiment of the invention.

Referring to FIG. 10, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system may include a memory controller 1200, an input/output ("I/O") bus 1250, and a disk driver controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the post package repair device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communication protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the figures and the accompanying claims. In addition to variations and modifications in the component parts and/or arrangements, alternative uses will also be apparent to those skilled in the art.

What is claimed is:

1. A post package repair (PPR) device comprising:
a plurality of bank groups, each including a fuse indicating repair information, configured to share a predetermined number of fuses;
a resource detection unit configured to generate a resource signal which determines whether the fuses from among the plurality of bank groups are available; and
a masking controller configured to output a masking signal which prevents repeated execution of a rupture operation when there is no unused fuse in response to the resource signal and a bank active signal,
wherein the masking controller is configured to control a masking operation per bank according to the bank active signal and the resource signal.

2. The post package repair (PPR) device according to claim 1, wherein the resource detection unit scans fuses unused in a boot-up operation, and outputs the scanned fuse information as the resource signal.

3. The post package repair (PPR) device according to claim 1, wherein a specific bank from among the plurality of bank groups is identified according to an arrangement order of the fuses.

4. The post package repair (PPR) device according to claim 1, wherein the resource detection unit includes:
a first bank from among the plurality of bank groups, configured to determine whether fuses arranged at a first line and a second line are used; and
a second bank located adjacent to the first bank, configured to determine whether fuses arranged at a third line and a fourth line are used.

5. The post package repair (PPR) device according to claim 1, wherein the resource detection unit classifies respective banks of the plurality of bank groups according to a specific mat region, and determines a presence or an absence of resources of the fuses.

6. The post package repair (PPR) device according to claim 1, wherein the masking controller includes:
a first bank resource comparator configured to compare a first bank active signal with the resource signal, and output a comparison result;
a second bank resource comparator configured to compare a second bank active signal with the resource signal, and output an other comparison result; and a combination unit configured to combine an output signal of the first bank resource comparator with another output signal of the second bank resource comparator, and output the masking signal.

7. A post package repair (PPR) device comprising:
an Array Rupture Electrical fuse (ARE) array unit having a fuse array configured to store a failed address;
a boot-up controller configured to scan the fuse array during a post package repair (PPR) operation, and output fuse resource information;
a resource detection unit configured to store the fuse resource information, and output a resource signal indicating whether a fuse is available;
a masking controller configured to output a masking signal which prevents repeated execution of a rupture operation when there is no unused fuse in response to the resource signal and a bank active signal; and
a rupture controller configured to control a rupture operation of the ARE array unit in response to the masking signal,
wherein the masking controller controls a masking operation per bank in response to the bank active signal and the resource signal.

8. The post package repair (PPR) device according to claim 7, wherein the resource detection unit detects resource information of a corresponding region in response to a fuse address, a channel selection signal, a mat selection signal, a bank-group selection signal, and a bank selection signal, and outputs the resource information to the masking controller.

9. The post package repair (PPR) device according to claim 7, further comprising:
a plurality of bank groups, each including fuses indicating repair information, configured to share a predetermined number of fuses, so that a left bank or a right bank from among the plurality of bank groups is selected in response to a bank selection signal.

10. The post package repair (PPR) device according to claim 7, wherein the masking controller includes:
a first bank resource comparator configured to compare a first bank active signal with the resource signal, and output a comparison result;
a second bank resource comparator configured to compare a second bank active signal with the resource signal, and output an other comparison result; and
a combination unit configured to combine an output signal of the first bank resource comparator with another output signal of the second bank resource comparator, and output the masking signal.

11. The post package repair (PPR) device according to claim 10, wherein the combination unit performs an AND operation between the output signal of the first bank resource comparator and the other output signal of the second bank resource comparator, and outputs the masking signal.

12. The post package repair device according to claim 7, wherein the resource detection unit is configured to make a distinction among a per-channel region, a per-bankgroup region, a per-left/right-bank region, and a per-mat region, and output the resource signal according to a distinction result.

13. The post package repair device according to claim 7, wherein:
two banks are classified into one bank group to share fuse lines,
a first bank from among the two banks is configured to determine whether a first fuse line and a second fuse line are used, and
a second bank located adjacent to the first bank is configured to determine whether fuses arranged at a third fuse line and a fourth fuse line are used.

14. A post package repair (PPR) device comprising: a plurality of bank groups each including fuse lines allocated for a PPR operation; a resource detection unit configured to detect resource information of each bank in the plurality of bank groups and output a resource signal; and a masking controller configured to receive the resource signal and perform a masking operation for each of the banks of the plurality of bank groups during the PPR operation, wherein the masking controller is configured to compare a bank active signal that indicates an active state of the banks among the plurality of bank groups with the resource signal, and activate a masking signal.

15. The PPR device according to claim 14, further comprising:
a rupture controller configured to receive a masking signal from the masking controller to prevent repeated execution of a rupture operation.

16. The PPR device according to claim 15, wherein the rupture controller is configured to output a rupture control signal to control the rupture operation in response to receiving the masking signal.

17. The PPR device according to claim 15, wherein the masking controller is configured to output the masking signal to the rupture controller when an unused fuse is not present.

* * * * *